United States Patent [19]

Kurtz

[11] 4,025,942
[45] May 24, 1977

[54] LOW PRESSURE TRANSDUCERS EMPLOYING LARGE SILICON DIAPHRAGMS HAVING NON-CRITICAL ELECTRICAL PROPERTIES

[75] Inventor: Anthony D. Kurtz, Englewood, N.J.

[73] Assignee: Kulite Semiconductor Products, Inc., Ridgefield, N.J.

[22] Filed: May 5, 1976

[21] Appl. No.: 683,498

Related U.S. Application Data

[63] Continuation of Ser. No. 451,860, March 18, 1974, abandoned.

[52] U.S. Cl. .................................. 357/26; 357/73; 73/88.5 SD; 338/4; 338/5
[51] Int. Cl.² .............. H01L 29/84; H01L 29/96; H01L 23/30; B01B 7/16
[58] Field of Search .................. 357/81, 26, 73; 73/88.5 SD; 338/4, 5

[56] References Cited

UNITED STATES PATENTS

| | | | |
|---|---|---|---|
| 3,588,632 | 6/1971 | Nakata | 357/81 |
| 3,739,315 | 6/1973 | Kurtz et al. | 357/26 |
| 3,800,264 | 3/1974 | Kurtz et al. | 357/26 |
| 3,868,719 | 2/1975 | Kurtz et al. | 357/26 |
| 3,922,705 | 11/1975 | Yerman | 357/26 |

*Primary Examiner*—Andrew J. James
*Attorney, Agent, or Firm*—Arthur L. Plevy

[57] ABSTRACT

A low pressure transducer and methods of fabricating the same employ piezoresistive bridges deposited on or diffused within a wafer of n-type silicon, the wafer is secured to a glass sheet and is then bonded to a silicon diaphragm of a relatively large size and fabricated from a distinct piece of silicon of non-critical electrical characteristics. Methods for producing a plurality of such devices by using compatible processing steps are also provided.

8 Claims, 14 Drawing Figures

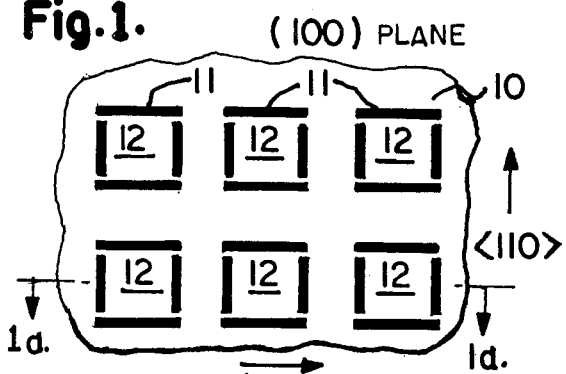
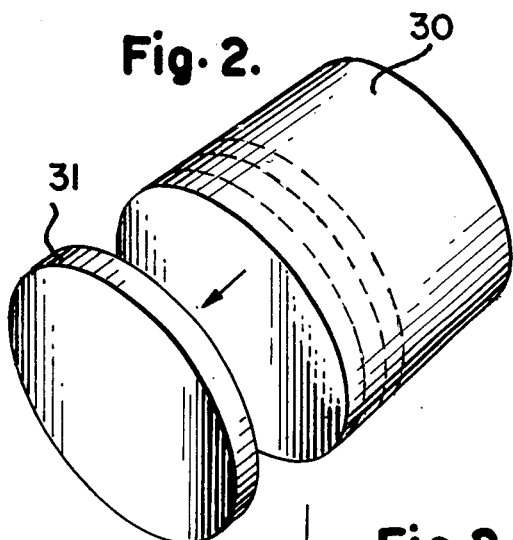

LOW PRESSURE TRANSDUCERS EMPLOYING LARGE SILICON DIAPHRAGMS HAVING NON-CRITICAL ELECTRICAL PROPERTIES

This is a continuation of application Ser. No. 451,860, filed Mar. 18, 1974, and now abandoned.

BACKGROUND OF INVENTION

In the past transducers were fabricated and referred to as integral silicon diaphragm pressure transducers. Such devices are fabricated from solid state techniques and basically involve the diffusion or disposition of a force sensitive arrangement of piezoresistors on a silicon diaphragm. The integral silicon diaphragms can be made containing a four active arm Wheatstone Bridge, which integral assembly provides an output proportional to pressure and/or deflection. The stress sensors or piezoresistors are arranged so that under load two elements are put in tension and two in compression.

The term integral is used to denote the fact that the sensors, instead of being secured to the diaphragm by means of an epoxy or glue are actually deposited, diffused or otherwise formed on the silicon diaphragm and are electrically isolated therefrom by means of P-N junctions or epitaxial layers. In any event, the silicon diaphragm is carefully selected so that it exhibits the necessary electrical characteristics so that use can be made of the same to permit the fabrication of accurate and controllable piezoresistive sensing elements.

The diaphragms of the prior art were supplied in varying thicknesses as the thickness determines the rated load and output.

The resultant structure was clamped about its peripheral edge to a suitable housing and responded to forces directed thereat to cause diaphragm deflection and resistivity changes in the sensors according to the deflection.

For a clamped edge diaphragm, the center stress is given by:

$$\sigma_c = \frac{3W(m+1)}{8\pi m t^2}$$

where $W = P\pi a^2$, and P is the pressure, a is the effective radius of the diaphragm, that radius determined is of the active area as distinguished form the clamped area.

$t$ = diaphragm thickness
$M$ = reciprocal of Poisson's ratio. The strain is defined as
$E = \sigma/Y$
$Y$ = Young's modules for silicon = $30 \times 10^6$ p.s.i.
$\sigma$ = center stress or stress The natural frequency of a diaphragm is important as it is the frequency at which the diaphragm is most sensitive at or will resonate at. The natural frequency of a clamped diaphragm is given by $$fn = \frac{t}{a^2}\sqrt{\frac{Yg}{3\pi^2(1-r)P}}$$

and for silicon $$fn = 7.8 \times 10^4 \frac{T}{a^2} \text{ Hertz}$$

The greater the thickness the higher the natural frequency, while the greater the area the lower the natural frequency is as the natural frequency is inversely proportional to the square of the radius of a diaphragm.

Since silicon has a very high stiffness to density ratio, with a modulus essentially equal to that of steel and a density comparable to aluminum, together with the fact that high piezoresistive coefficients of silicon piezoresistors and small size have resulted in gages with high natural resonant frequencies.

In any event, there is a plurality of transducers which are employed to monitor low frequency operation, such as barometric pressure or ultra-low frequency operations.

Due to the nature of such measurements, there is a desire that such transducers be as low in cost as possible while maintaining highly accurate pressure measurements.

It is therefore an object of the present invention to provide a low cost transducer structure useful for measuring relatively low frequency phenomenon while maintaining highly accurate outputs.

BRIEF DESCRIPTION OF PREFERRED EMBODIMENT

A pressure transducer for low pressure application comprises a wafer of n-type silicon having a top surface and a bottom surface which is relatively smooth, a piezoresistive element is diffused into said top surface of said n-type wafer, a silicon diaphragm of a given diameter is fabricated from a separate and distinct piece of silicon of a different conductivity, means bond said wafer to said diaphragm which means include a glass bond. The transducer as described is fabricated in a manner to provide a large yield of such structures by a series of compatible method steps.

BRIEF DESCRIPTION OF FIGURES

FIG. 1 is a partial top view of a silicon wafer having deposited thereon a plurality of bridge patterns.

FIG. 1A is a cross-sectional view of FIG. 1 taken through line 1A—1A.

FIG. 1B—1G shows various steps necessary in fabricating a plurality of transducers according to the invention.

FIG. 2 is a perspective view of a diaphragm producing silicon member according to this invention.

FIG. 2A — 2D show steps required in an alternate method of fabricating a transducer according to this invention.

FIG. 3 is a cross-sectional side view of an alternate embodiment of a transducer assembly.

DETAILED DESCRIPTION OF FIGURES

Referring to FIG. 1, there is shown a partial top view of a silicon wafer 10 having diffused therein a plurality of piezoelectric devices 11, each associated with a separate bridge pattern 12, and therefore shown as 4 separate lines.

While only six such bridge configurations as 12 are shown, it is known that a multiplicity of such patterns can be formed upon a suitable silicon wafer 10. For example, it is estimated that on a slice of silicon or a wafer of silicon 10 of about two inches in diameter, a series of 1200 to 1600 bridge patterns 12 of about 0.050 inches by 0.050 inches area; can be formed.

Each pattern 12 as diffused is a complete four arm bridge (Wheatstone configuration) with two of the piezoresistors having large longitudinal piezoresistive coefficients. Such an arrangement may be in the 100 plane with the elements directed along the <110> directions.

Therefore the entire array of sensor bridge patterns (1200 to 1600) may be diffused upon a thin wafer of (110) plane n-type silicon cut or processed from a single crystal of silicon. The resultant bridge assembly 12 uses both longitudinal and transverse piezoresistive elements to allow greater sensitivity and increased output.

While many prior art transducers have relied mainly on the longitudinal piezoresistive effect, there are a number of transducers available which make use of both the longitudinal as well as the transverse or shear piezoresistive effect. See a paper entitled, "SEMICONDUCTOR TRANSDUCERS USING TRANSVERSE AND SHEAR PIEZORESISTANCE," preprint Number P4-1-PHYMMID-67 presented at the 22nd Annual Conference and Exhibit of the Instrument Society of America, September 11–14, 1967 at Chicago, Illinois by Anthony D. Kurtz and Charles L. Gravel, both employed by the assignee herein. For further details in regard to piezoresistive coefficients, crystallographic axis and bridge configurations, reference is also made to a Bell Telephone Laboratories publication entitled, "SEMICONDUCTOR STRESS TRANSDUCERS UTILIZING THE TRANSVERSE AND SHEAR PIEZORESISTIVE EFFECTS," by W. G. Pfann and R. N. Thutston, dated May 5, 1961.

Basically the elements comprising each arm of the bridge are obtained on the silicon diaphragm by P-N junction isolation utilizing solid state diffusion and oxide masking or dielectric isolation utilizing silicon dioxide as a dielectric and epitaxially grown silicon as the monolithic structure.

It is understood, however, that the wafer 10 to be processed has to be of the 110 plane, n-type silicon and be fabricated from a single crystal to assure high piezoresistive coefficient and so on. However, a single photolithographic masking technique provides in excess of 1000, such bridge configurations on such a wafer as 10. In the prior art, the wafer 10 would also be used for the diaphragm.

Since such diaphragms are relatively large (½ inches or larger in diameter) for low pressure application (15 psi or less) one under prior art fabrication techniques would obtain a fraction of the total number of transducer bridge assemblies.

The material used to form the wafer 10 and hence, the patterns is relatively expensive due to its purity and single crystal qualities and is not, as will be seen, to be used as the diaphragm material.

Referring to FIG. 1A, there is shown a cross-sectional side view of the multiplicity of bridge patterns of FIG. 1.

The wafer 10, after the diffusion or other process, is then mechanically lapped, or etched to reduce the effective thickness to that shown by dashed line 14.

Thus, in FIG. 1B, the wafer 10 and associated bridges has a thickness of about 1–2 mils. The surface below the bridge configurations or bottom surface of the wafer 10 is polished or lapped to a smooth finish. The polishing step is such as to almost produce an optical flat.

A glass sheet 16 (FIG. 1C) is then secured or bonded to the polished surface of the wafer 10. The glass sheet is relatively thin (2–3 mils thick) and the surface to be bonded is also polished. Preferably a low melting point glass is used such as a borosilicate glass, one surface of the glass to be bonded is also lapped and polished to provide a good, smooth surface. The glass sheet may be bonded to the silicon by a diffusion bonding technique as shown in FIG. 1C.

This is accomplished by placing the corresponding surfaces of the glass and silicon into close and intimate contact and exerting pressure between the parts by means of pressure blocks 20 and in the presence of an elevated temperature in the range of about 800° F or more. The temperature is below the melting point of the particular glass used in sheet 16.

Simultaneously therewith a source of potential 25 is applied between the parts to permit the flow of ions to form a thin bond at the interface of the glass 16 and silicon 10. The bond thus formed is ionic in nature and is afforded by a transportation of glass ions into the silicon and vice versa. The technique is known in the art as providing a bond of Angstrom units thickness. The bond therebetween is uniform due to the pressure applied as well as the optical-like finish provided by the corresponding surfaces of the glass and silicon. Other bonding techniques may be employed as well. The glass sheet 16 and wafer 10 after bonding form a composite structure. Thus, after step 1C, one has a glass backed wafer containing over one thousand individual bridge arrangements or over one thousand transducer structures. The composite structure is then scribed or cut to separate the bridge patterns into individual cells as shown in FIG. 1D.

Referring to FIG. 2, there is shown a bar or wafer of silicon 30. The silicon wafer 30 is shown as cylindrical in shape, but any other desired shape can be used as well.

This solid 30 is used to form individual diaphragms for the cells 12 as obtained after the scribing or cutting step shown in FIG. 1D.

The large slice of silicon 30 does not posess any critical electrical properties, it does not have to be n or p-type, nor does it require any particular purity, as there are to be no elements diffused therein and hence, semiconductor processing techniques are avoided and are not implemented in conjunction with the wafer 30. The only characteristic of wafer 30 is that it be preferably formed from single crystal silicon for strength and rigidity. Since silicon possesses the qualities above-described as to Young's modulus and so on, it is an excellent force collector and hence serves as an excellent diaphragm. Selected slices, (see dotted lines of FIG. 2) are selected from wafer 30 depending upon the desired diaphragm thickness (1 to 5 mils thick) depending upon the pressure to be monitored and according to the pressure equation given above for an edged clamp diaphragm. Therefore by selecting a desired stress level, the required thickness can be computed.

Thus FIG. 2A shows and specifies a silicon diaphragm 31 obtained from the above described wafer 30.

The wafer 31 can be directly bonded to a bridge element 12 as shown in FIG. 1E by an inorganic bonding technique similar to that described in FIG. 1C, using pressure, heat and a source of potential 35.

Thus, one now obtains a semiconductor bridge 12 intimately secured to a silicon diaphragm 31 or a complete force transducer. The wafer 31 can be etched to form a annular member with the outer edge 36 forming a ridge for added strength and rigidity. The area within the depression 37 defines the active area of the diaphragm or that area which most readily deflects upon application of a force to the composite structure. The depression 37 can be formed prior to step 1E or as desired. FIG. 1G shows the transducer assembly of FIG. 1F secured to a glass ring 40. This step of securing the ring 40 to the transducer can also be accomplished by the process outlined in FIGS. 1C and 1E or alternately by means of a powdered frit technique. Leads and terminals 38 and 39 are implemented and the inverted H-shaped structure is now bonded or mounted on a conventional housing 45, which may be fabricated from KOVAR, steel or some other metal. Thus one has a low pressure transducer assembly including a large area diaphragm fabricated from inexpensive and non-critical wafer of silicon. The wafer 12, as bonded to the diaphragm 31 is usually positioned near the outer edge of the diaphragm to assure uniform stress and reliability.

Referring to FIG. 2B, there is shown an alternate procedure for fabricating transducer assembly. The diaphragm 31 as removed from wafer 30, is etched to form a transducer accommodating aperture 42. The aperture 42 is located near the outer edge of the active area of the diaphragm and is dimensioned to accommodate the cell 12. Thus, the depth of the depression is about 2 mils or less while the area is about 0.050 × 0.050 inches. The cell 12 is then inserted into the depression 42 (FIG. 2C) and bonded thereto by means of the pressure, heat and current bonding step above described.

The advantage of the unit shown in FIG. 2C is that the thickness of the diaphragm including the wafer 12 is uniform as compared to the structure shown in FIG. 1F; thus resulting in less stiffness to the final transducer. This however, is not critical as transducers employed by the steps of FIG. 1 are quite sufficient for low pressure measurement.

FIG. 2D shows the depression formed to define the active and non-active areas. Again it is noted that this step can be provided before securing the cell 12 to the diaphragm. The structure of FIG. 2D is then treated and processed as that shown in FIG. 1F and is secured to a glass ring 40 and to a metal housing 45 as desired.

Referring to FIG. 3, there is shown a bridge pattern 50 as the one obtained after a scribing process as indicated in FIG. 1D for example.

The transducer 50 is again bonded to a silicon wafer 51 selected according to the above description and done so by means of a diffusion bond 53.

The wafer 51 is now secured to a glass ring 55. The glass ring 55 is an annular member and may have the periphery of the surface to be bonded to the silicon wafer 51 metallized to facilitate a diffusion bond of the wafer 51 to the glass ring 55. The entire structure is then secured to a ceramic or integrated circuit header 56 by means of an epoxy bond or an alternate bonding technique.

The ceramic circuit bond 56 is a standard IC header and has pins or posts 57 mounted thereto. A gold wire or other reliable non-corrosive lead is directed from the terminal position on the wafer 50 to the post to afford an electrode for use in measurement apparatus.

It is also understood that an additional ring 62 (shown dashed) can be mounted on the opposite surface of the diaphragm 51 as well to form an H-shaped composite configuration.

While the diaphragm depicted in FIG. 3 is indicated as silicon, because of the above described desirable properties of silicon, it can also be fabricated from glass. Glass can serve as a diaphragm and is force responsive. One would then replace diaphragm 51 with a glass structure and then bond the bridge assembly 50 directly thereto.

It is also noted that after the step shown in FIG. 1D or 1C, one could then remove the entire glass backing by use of a hydraflouric etch and obtain a "web" or a bridge consisting only of thin silicon configurations.

This structure as can be understood has the appearance of the bridge (12) of FIG. 1 but are silicon piezoresistors without any backing. The silicon web can then be affixed to either a glass, silicon or metal diaphragm by a suitable bonding technique.

I claim:

1. A pressure transducer for pressure measurements of about 15 psi or less, comprising:
   a. a wafer of n-type silicon having a top surface and a relatively smooth bottom surface,
   b. a piezoresistor diffused into said top surface of said n-type silicon wafer,
   c. a silicon diaphragm fabricated from a separate and distinct piece of silicon of non-critical electrical properties as compared to said wafer, said diaphragm being much larger than said wafer,
   d. means bonding said wafer at said bottom surface at a position on said diaphragm removed from said center, said means including a glass bond, and
   e. housing means coupled to said diaphragm about the outer periphery thereof to position the same in a pressure sensing mode.

2. The transducer according to claim 1 wherein said means bonding said wafer is a glass bond formed by a diffusion process.

3. The transducer according to claim 1 wherein said piezoresistive element is a Wheatstone bridge configuration comprising four piezoresistors arranged in the <110> directions.

4. The transducer according to claim 1 wherein said silicon diaphragm has a diameter of at least one-half inch.

5. The transducer according to claim 1 wherein said housing is fabricated from a metal.

6. A pressure transducer for pressure measurements relatively about 15 psi or less, comprising a wafer of single crystal silicon of a given and specified conductivity having diffused on a surface thereof a piezoresistor bridge pattern, said opposite surface of said wafer being relatively smooth, a silicon diaphragm of a size much larger than said wafer and fabricated from a distinct piece of silicon of non-critical electrical properties compared to said wafer and having a smooth, complemental surface to said opposite surface of said wafer, said complemental surface including a depression for accommodating said wafer, and means for bonding said wafer within said depression.

7. A pressure transducer for pressure measurements relatively about 15 psi or less, comprising a bridge pattern fabricated from a contiguous piece of silicon of a given and specified conductivity, a diaphragm member of a size much larger than said pattern, fabricated from a piece of silicon of different non-critical electrical characteristics from said contiguous piece and of the type not adapted to accommodate diffusion of bridge patterns, having a smooth surface for accommodating said bridge pattern and means securing said pattern to said diaphragm, said means including a bond fabricated from the transportation of ions between media due to said means to secure said pattern to said diaphragm member.

8. The pressure transducer according to claim 7 wherein said means includes a glass bonding means.

* * * * *